United States Patent [19]

Tseng

[11] Patent Number: 5,567,640
[45] Date of Patent: Oct. 22, 1996

[54] METHOD FOR FABRICATING T-SHAPED CAPACITORS IN DRAM CELLS

[75] Inventor: Horng-Huei Tseng, Hsinchu, Taiwan

[73] Assignee: Vanguard International Semiconductor Corporation, Hsin-Chu, Taiwan

[21] Appl. No.: 583,789

[22] Filed: Jan. 11, 1996

[51] Int. Cl.⁶ .......................... H01L 21/70; H01L 27/00
[52] U.S. Cl. .................. 437/52; 437/60; 437/919
[58] Field of Search .................. 437/47–48, 52, 437/60, 919; 148/DIG. 14; 251/206–210

[56] References Cited

U.S. PATENT DOCUMENTS

| | | | |
|---|---|---|---|
| 5,084,405 | 1/1992 | Fazan et al. | 437/52 |
| 5,286,668 | 2/1994 | Chou | 437/52 |
| 5,346,844 | 9/1994 | Cho et al. | 437/52 |
| 5,403,766 | 4/1995 | Miyake | 437/52 |
| 5,432,116 | 7/1995 | Keum et al. | 437/60 |

*Primary Examiner*—H. Jey Tsai
*Attorney, Agent, or Firm*—George O. Saile; William J. Stoffel

[57] ABSTRACT

The present invention provides a method of manufacturing a T-shaped capacitor for a DRAM which uses one mask to define both the node contact hole and the bottom electrode. This novel one mask method uses an oxygen plasma treatment to enlarge a first opening (the node contact opening) in the resist layer to create a slightly larger second opening which defines the storage electrode. This method reduces the number of masking steps used and therefore reduces process costs and increases yields. The process comprises forming an insulation layer and a resist layer having a first opening over an active area. Next, the insulation layer is etched through the first opening forming a node contact hole extending partially through the insulation layer. The first opening is widened with an oxygen plasma etch to form a slightly larger second opening. Then, the insulation layer is etched through the second opening forming a storage electrode hole and the node contact hole is extended to expose the source. The resist layer is removed. A polysilicon layer is formed that completely fills the node contact hole and the storage electrode hole and covers the first insulation layer. The polysilicon layer covering the first insulation layer is removed thereby forming the T-shaped storage electrode. The first insulation layer is removed. A capacitor dielectric layer and a top electrode are formed over the T-shaped storage electrode thus completing the T-shaped capacitor.

20 Claims, 5 Drawing Sheets

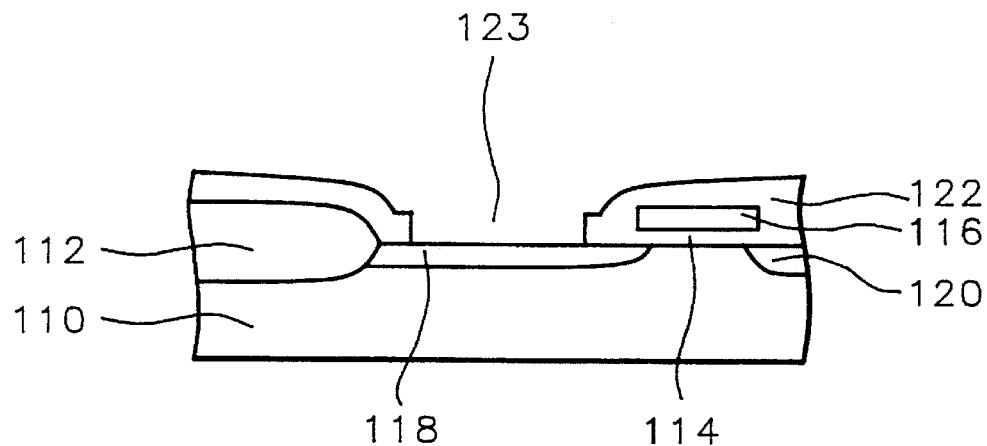
*FIG. 1A - Prior Art*
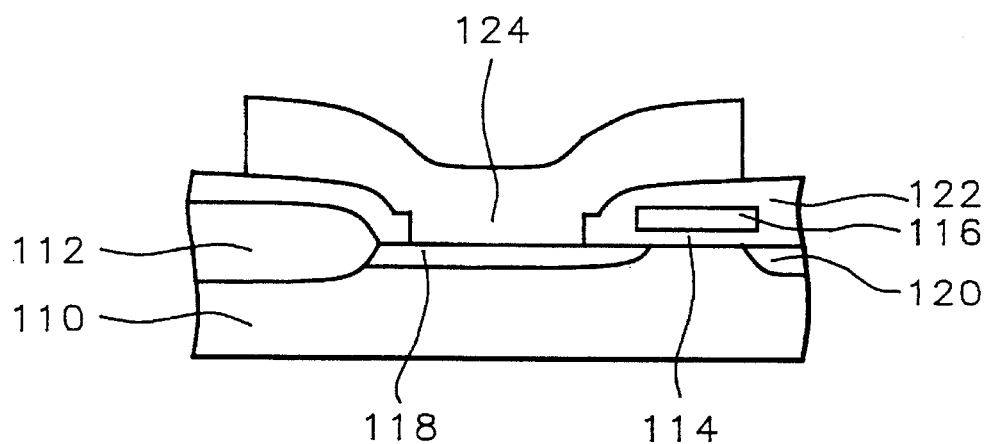
*FIG. 1B - Prior Art*
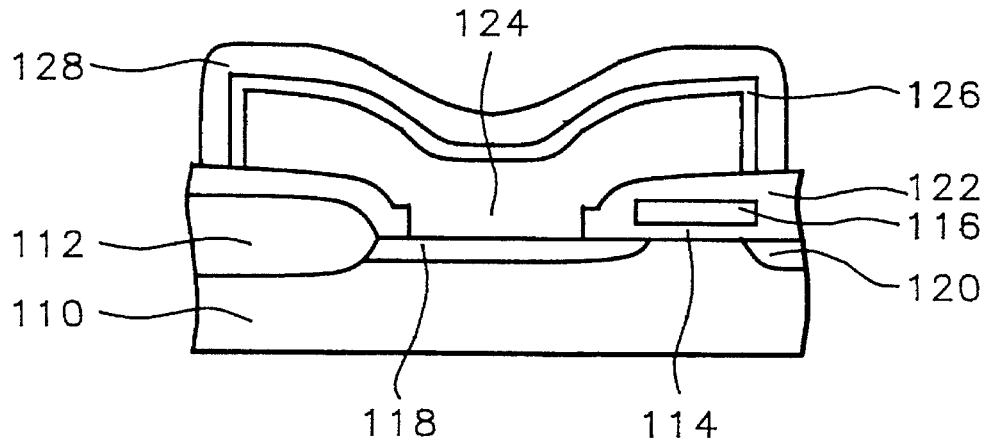
*FIG. 1C - Prior Art*

METHOD FOR FABRICATING T-SHAPED CAPACITORS IN DRAM CELLS

BACKGROUND OF THE INVENTION

1) Field of the Invention

This invention relates generally to fabrication of capacitors in a DRAM cell and more particularly to a method and process for fabricating T-Shaped capacitors with a large capacitance.

2) Description of the Prior Art

A dynamic random access memory (DRAM) cell is in general a semiconductor memory device with one transistor and one capacitor, in which a data of one-bit can be stored in the capacitor by the charge stored therein. As a tendency to raise the density of an integrated semiconductor device causes the density to the DRAM cells to be increased, the area occupied by the one memory cell becomes gradually decreased. Therefore, the present invention is devoted to the manufacture of a capacitor with a maximum capacity in a limited area with a minimum number of photolithographic steps Semiconductor technologies have dramatically increased the circuit density on a chip. The miniaturized devices built in and on semiconductor substrate are very closely spaced and their packing density has increased significantly. More recent advances in photolithographic techniques, such as phase-shifting masks, and self-aligning process steps have further reduced the device sized and increased circuit density. This has lead to ultra large scale integration (ULSI) with minimum device dimensions less than a micrometer and more than a million transistors on a chip. With this improved integration, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field effect transistor (MOS-FET) and a single capacitor are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of the memory cell as well as consumes excessive power during low-voltage operation by impeding device operation.

FIGS. 1A–1C represent prior art fabrication processes for forming a capacitor. In FIG. 1 A, a field oxide layer 112 for the separation of respective cells is formed in a portion of a substrate 110 of a first conductivity. Then, in order to prepare a source region 118, a layer of second conductivity is formed by an ion injection near the field oxide layer 112. A drain region 120 separately distanced from the field oxide layer 112 is formed. A first oxide layer 122 covers the entire surface of the substrate 110 except some parts of the source region 118. Between the source and drain regions 18, 20, a gate electrode 116 is formed thereon, while a gate oxide layer 114 is provided as an intermediate layer. Thereafter, a source contact region 123 is formed by etching the first oxide layer 122 on the source regions 118, in a manor of a conventional etching process.

In FIG. 1B, after formation of the first polycrystalline silicon layer over the source region 118, a storage electrode 124 is formed by etching the predetermined region of the first polycrystalline layer.

In FIG. 1C, the capacitor having a typical stacked structure is completely fabricated by forming a plate electrode 128 along the top surface of a dielectric layer 126 by etching a predetermined region after spreading the dielectric layer 126 on the surface of the storage electrode 124 and by forming a second polycrystalline silicon over the entire surface of the substrate 110. In a conventional stacked-capacitor, as shown in FIG. 1C, when the area occupied by a cell is reduced, the areas occupied by the storage electrode 124 and the plate electrode 128 are also reduced. Therefore there is a problem in that sufficient capacity required in a high density memory device of more than 64 mega bits can not be made using conventional lithography techniques unless a method is developed that further miniaturizes the size of the storage electrode below photo dimensional limitations.

Generally, in a 54 MB DRAM having a 1.5 µm$^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and structured capacitors. However, the processes used to make these three dimensional capacitors are complicated and expensive. Therefore a method is need to fabricate a stacked capacitor having a size smaller that that capable by lithographic processes and which is uncomplicated.

The following U.S. patents show related processes and capacitor structures: Miyake, U.S. Pat. No. 5,403,766; and Keum et al. U.S. Pat. No. 5,432,116. However, many of the prior art methods require substantially more processing steps or/and planar structures which make the manufacturing process more complex and costly. Also, other process methods rely on etching to a predetermined etch depth which can be quite difficult to control in a manufacturing environment. For example, during plasma etching outgassing, virtual or real leaks, back streaming from pumps and loading effects, to name a few, can change the chemistry of the etching environment in the process chamber, making a calibrated etch time approach difficult to control. Therefore, it is very desirable to develop processes that are as simple as possible and also provide methods for monitoring, in situ, the etch depth during processing.

There is a challenge to develop methods of manufacturing these capacitors that minimize the manufacturing costs and maximize the device yields. In particular, there is a challenge to develop a method which minimizes the number of photoresist masking operations and to provide maximum process tolerance to maximize product yields. There is also a challenge to develop a capacitor that is not limited in size by the photolithographic techniques.

SUMMARY OF THE INVENTION

It is an object of the present invention to provide a method for fabricating a capacitor that overcomes the limitations of photographic techniques and which reduces the number of masking steps.

It is an object if the present invention to provide a method for fabricating a capacitor having a high density and capacitance.

It is an object of the present invention to provide a method for fabricating a DRAM having a T shaped capacitor with a high density and capacitance that is low cost and simple to manufacture.

To accomplish the above objectives, the present invention provides a method of manufacturing a capacitor for a DRAM where one resist mask is used to define both the node contact hole and the bottom storage electrode. This novel one mask method uses a lateral photoresist etch to enlarge a first opening (e.g., node contact opening) in the resist layer thereby defining a slightly larger second opening which defines the bottom storage electrode. Also, the invention uses only one blanket etch to define the storage node from a blanket polysilicon layer. This method reduces the number of masking/etch steps and therefore reduces process costs and increases yields.

Briefly, the method comprises forming a first insulation layer and a resist layer having a first opening over an active area on a substrate. A node contact hole is etched partially through the first insulation layer. Next, the first opening is enlarged with an oxygen plasma treatment to form a slightly larger second opening. The first insulation layer is anisotropically etched through the second opening forming a storage electrode hole in the insulation layer with the same dimensions as the second opening. Also, the node contact hole is extended to expose the node on the substrate surface. The resist layer is then removed. A polysilicon layer is formed that completely fills the node contact hole and the storage electrode hole and covers the top surface of the first insulation layer. Next, the first polysilicon layer on top of the first insulation is etched away. The first insulation layer is then selectively etched away thereby forming a T-shaped storage electrode from the reaming first polysilicon layer. The capacitor is completed by forming a dielectric layer and a top electrode over the storage electrode.

In slightly more detail, the present invention provides an improved method of fabricating a capacitor on a substrate having two spaced gate electrodes, one of the gate electrodes formed over a field oxide layer, and one of the gate electrodes formed on the substrate disposed between a source and a drain. The method comprising the steps of forming a first barrier layer over the substrate surface and the gate electrodes forming a first insulation layer over the first barrier layer; forming a resist layer over the first insulation layer; the resist layer having a first opening over the source; etching a first hole in the first insulation layer, defined by the first opening; the first hole extending partially through the first insulation layer; the first hole having a depth less than the thickness of the first insulation layer; laterally etching the resist layer with an oxygen plasma thereby enlarging the first opening in the resist layer to form a second opening over the source; the second opening being concentric with the first hole and having a larger area than the first hole; anisotropically etching the first insulation layer using the resist layer as a mask and extending the first hole through the first insulation layer to expose the source region; and etching the first insulation layer through the second opening thereby forming a second hole into the first insulated layer to a depth less than the thickness of the first insulation layer; the second hole being defined by sidewalls of the first insulation layer; removing the resist layer; forming a first polysilicon layer completely filling the first hole and the second hole and covering the top surface of the first insulation layer; etching the first polysilicon layer thereby exposing the first insulation layer; selectively etching the first insulation layer thereby forming a T-shaped storage electrode from the remaining first polysilicon layer; forming a dielectric layer and a top electrode over the storage electrode; and forming a top insulation layer over the resulting structure thereby completing the memory cell. This method reduces the masking/etch steps used and therefore reduces process costs and increases yields. Also, the capacitor is smaller than possible using conventional photohthographic techniques.

BREIF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

The drawings show the following:

FIGS. 1A through 1C show a prior art process for forming a capacitor.

DETAILED DESCRIPTION OF THE PREFERRED EMBODIMENTS

The present invention will be described in detail with reference to the accompanying drawings. It should be noted that the drawings are in greatly simplified form. In practice, the semiconductor substrate will have many device structures formed within and thereon and the devices can be connected with suitable metallurgy in various electronic electric circuit configurations.

The present invention provides a method of forming a DRAM having a T-shaped capacitor which has small dimensions, high capacitance and is simple to manufacture. First, the process for forming the field oxide (FOX) and the field effect transistor structure as presently practiced in manufacturing DRAM cells are only briefly described in order to better understand the current invention. Second, the novel method to fabricate the capacitor will be described in detail.

Figure 2:
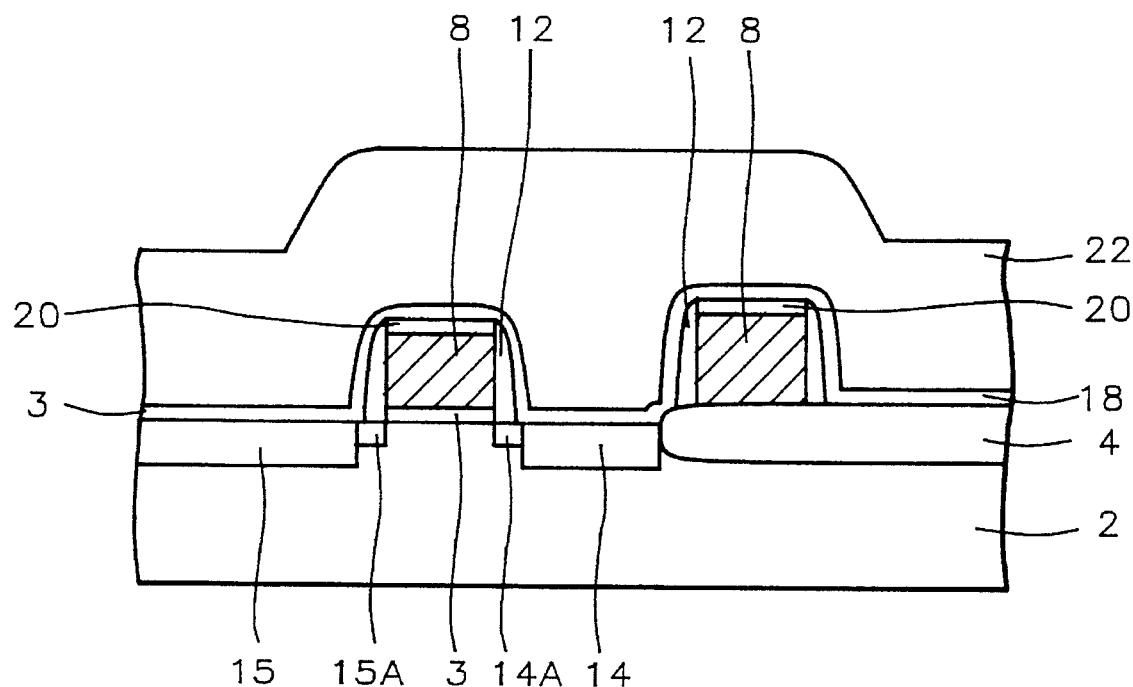
FIGS. 2 through 9 are cross sectional Views for illustrating the method for manufacturing a DRAM having a T shaped capacitor according to the present invention.

As shown in FIG. 2, the method begins by fabricating a capacitor in a substrate having a field oxide layer 4 and FET devices formed thereon. Field oxide layer 04 is formed on a semiconductor substrate 02 for defining active regions and isolation regions. The preferred substrate is composed of a P-type single crystal silicon having a (100) crystallographic orientation. A relatively thick field oxide (FOX) 4 is formed around the active device areas to electrically isolate these areas. This field oxide is formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness being in the ratige of about 3000 and 6000 Å.

The semiconductor FET device is then formed in the active device area after removing the silicon nitride barrier layer and the pad oxide in a conventional wet etch. The most commonly used device for dynamic random access memory (DRAM) is MOSFET. This device is formed by first thermally oxidizing the active device area to form a thin gate oxide 3. The preferred thickness being from about 50 to 200 Å.

An appropriately doped polysilicon layer and an insulating layer are deposited on substrate 2 and conventional hotolithographic techniques are used to pattern the gate oxide 3, polysilicon layer 16, and the insulating layer 20 which comprise the gate electrodes 03 16 20. As shown in FIG. 2, one of the gate electrodes is preferably formed over the field oxide layer 4 and one of the gate electrodes is formed on the substrate disposed between a source 8 and a drain 4. The gate on the substrate form the gate electrode of the MOSFET in the active device areas. The gate electrodes formed over he field oxide form word lines that electrically connect the MOSFET gate electrode to the appropriate peripheral circuits on the DRAM chip. The lightly doped source/drain 14A, 15A of the N-channel MOSFET is formed next, usually by implanting an N-type atomic species, such as arsenic or phosphorus, through the spaces between the gate electrodes 8. For example, a typical implant might consist of phosphorus P31 at a dose of between about 1E13 to 1E14 atoms/cm$^2$ and at an energy between about 30 to 80 Kev.

After forming he lightly doped source/drain 14A 15A, sidewall spacers 12 are formed on the gate electrode 8 sidewalls. The sidewall spacers facing the source 14 are called inside sidewall spacers. The sidewall spacers 12 are formed by depositing a low temperature silicon oxide and anisotropically etching back to the silicon surface. For example, the silicon oxide could be a chemical vapor position using tetraethoxysilane (TEOS) at a temperature in the range of about 650° to 900° and the etch back performed in a low pressure reactive ion etcher. The spacing between the sidewall spacers 12 is preferably in the range of between about 0.3 and 1.2 µm.

The source/drain regions 14 15 of the MOSFET are now implanted between the spacers 12 with a N type atomic species, for example, arsenic (As75), to complete the source/drain (e.g., the source is the node). The implantation is usually done through a thin layer of silicon oxide of about 200 to 300 Å in thickness to minimize implant channeling and to protect against contamination by metals another impurities. A typical implantation dose being between 2E15 to 1E16 atoms/cm$^2$ and an energy of between about 20 to 70 Kev.

The remainder this embodiment relates more specifically to those objects of the invention, which relate to the formation of the T-shaped storage capacitor having a smaller size, an increased capacitance, an also reducing the number of masking operations.

As shown in FIG. 2, a first barrier layer 18 is formed over the substrate surface and the gate electrodes. The barrier layer 18 is preferably formed of silicon nitride. The barrier layer 18 is preferably formed of silicon nitride having a thickness in the range of between about 500 and 2000 Å and more about 1000 Å. The first barrier layer 18 serves as an etch barrier for a subsequent etch first insulation layer 22.

A first insulating layer 22 is then formed over the first barrier layer 18. The first insulation layer can be formed of a material selected from the group consisting of: silicon oxide, a doped silicon oxide, phosphosilicate glass, and borophosphosilicate glass (BPSG). For example, a borophosphosilicate glass layer can be formed by low pressure chemical vapor deposition (LPCVD) using tetralhylorthosilicate (TEOS) as a reactant. Boron and phosphorus are added to the ambient during the formation of the borophosphosilicate glass layer. The layer is thermally treated at a temperature of 850° C. for about 30 minutes to cause flow and planarization. Alternately, the first insulation layer 22 can be plagiarized by a chemically mechanically polish (CMP) process.

The first insulation layer 22 is preferably formed of a chemical vapor deposition (CVD) oxide such as a TEOS oxide. The first insulation layer 22 can be formed using a tetraethylorthosilicate oxide (TEOS) by depositing silicon oxide at 650° to 750° C. in a low pressure chemical vapor deposition reactor. The first insulation layer 22 preferably has a thickness in the range of between about 5000 and 10,000 Å and more preferably about 8000 Å.

Figure 3:
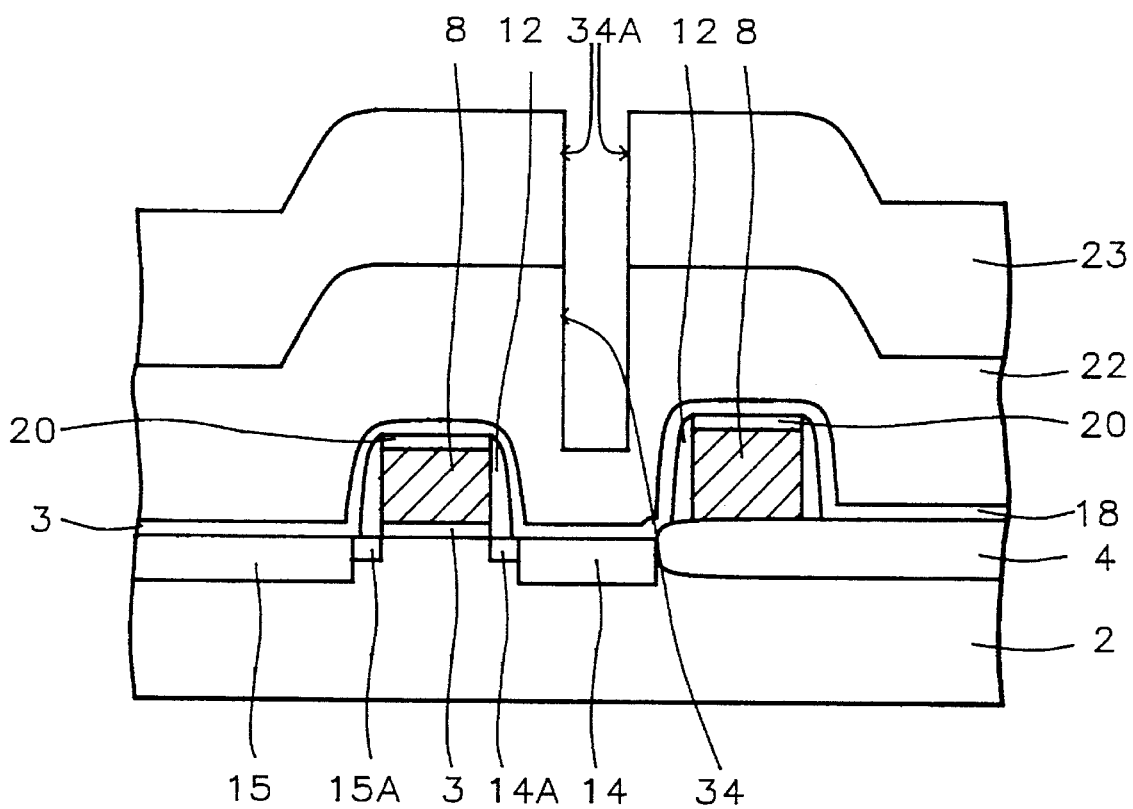

As shown in FIG. 3, a resist layer 23 is formed over the first insulation layer 22. The resist layer has a first opening 34A (i.e., a contact node opening) over the source 14 or node. The first opening 34A has an open dimension in the range of between about 0.1 and 0.5 µm and more preferably about 0.5 µm. The first opening can have almost any shape such as circular, rectangular and square. The first opening preferably has the smallest size possible by current photolithography capabilities.

A first hole 34 (e.g., node contact hole) is etched in the first insulation layer 22 defined by the first opening 34A in the resist layer. The first hole 34 extends partially through the first insulation layer 22. The first hole preferably has a depth less then the thickness of the first insulation layer. The first hole 34 preferably has a depth in the range of between about 3000 and 5000 Å and more preferably about 4000 Å. A timed anisotropic etch can be used to etch the BPSG first insulation layer using $CF_4/CHF_3/Ar$ reactants.

Figure 4:
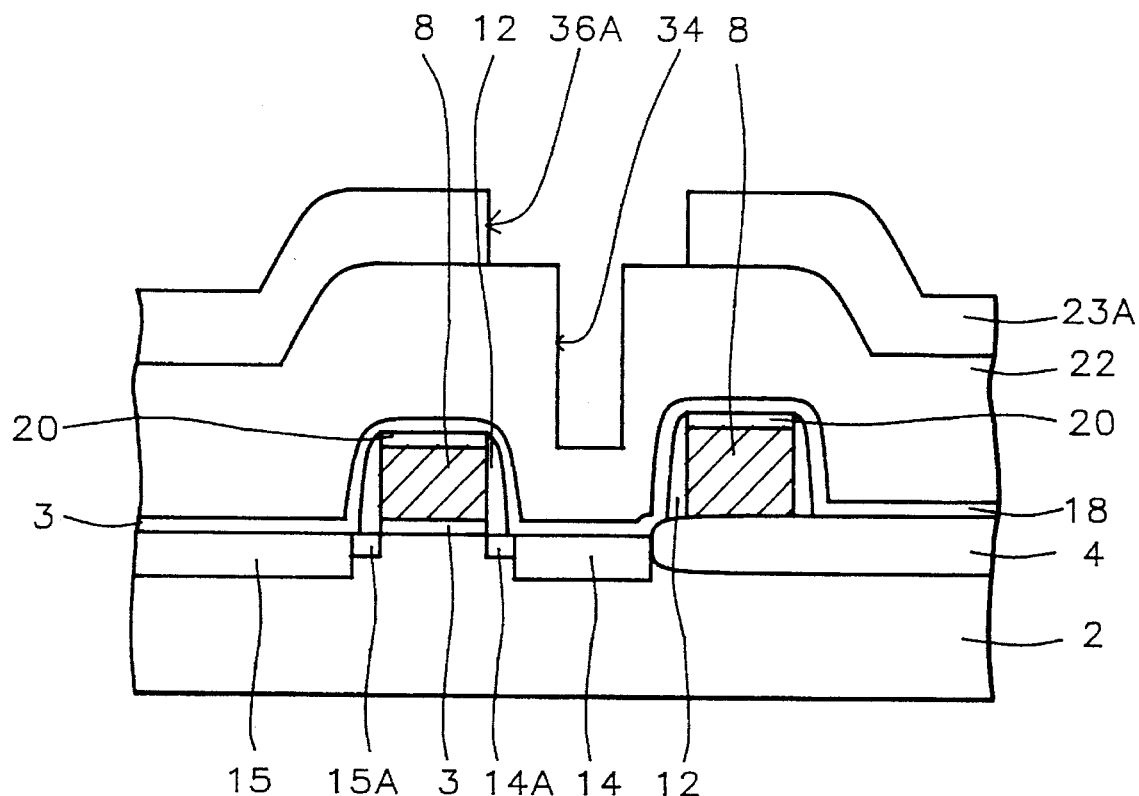

As shown in FIG. 4, the first opening 34A in the resist layer 23 is laterally etched to remove a width of photoresist thereby enlarging the first opening 34A to form a wider second opening 36A over the source 14. The second opening 36A can be concentric with the first hole and has a larger area the the first hole 34A. The second opening 36A in the resist layer 23A has an open dimension in the range of between about 0.2 and 0.7 µm. The lateral etch also removes a thickness of the resist layer 23A. The lateral etch can be performed with an oxygen plasma treatment performed in a barrel type photoresist striping tool or an oxide etcher with oxygen gas flow. The oxygen plasma treatment is preferably performed in a barrel type photoresist tool such as a resist stripper tool manufactured by Plasma Systems Corporation (PSC). The tool employs a low pressure electrical discharge to split molecular oxygen ($O_2$) into its more reactive atomic form (O ions). The oxygen ions then converts the photoresist into gaseous products that can be pumped away. Most barrel reactors (such as a plasma stripper) operate in a pressure range of 0.5 to 1.0 torr and have external electrodes and a 13.56 MHz quartz power supply. The wafers can be stacked horizontally and surrounded by a shield to reduce the wafer exposure to the charged species in the plasma. In addition, a descum process can be used to clear organic and photoresist residue from contact holes before the plasma treatment.

Figure 5:
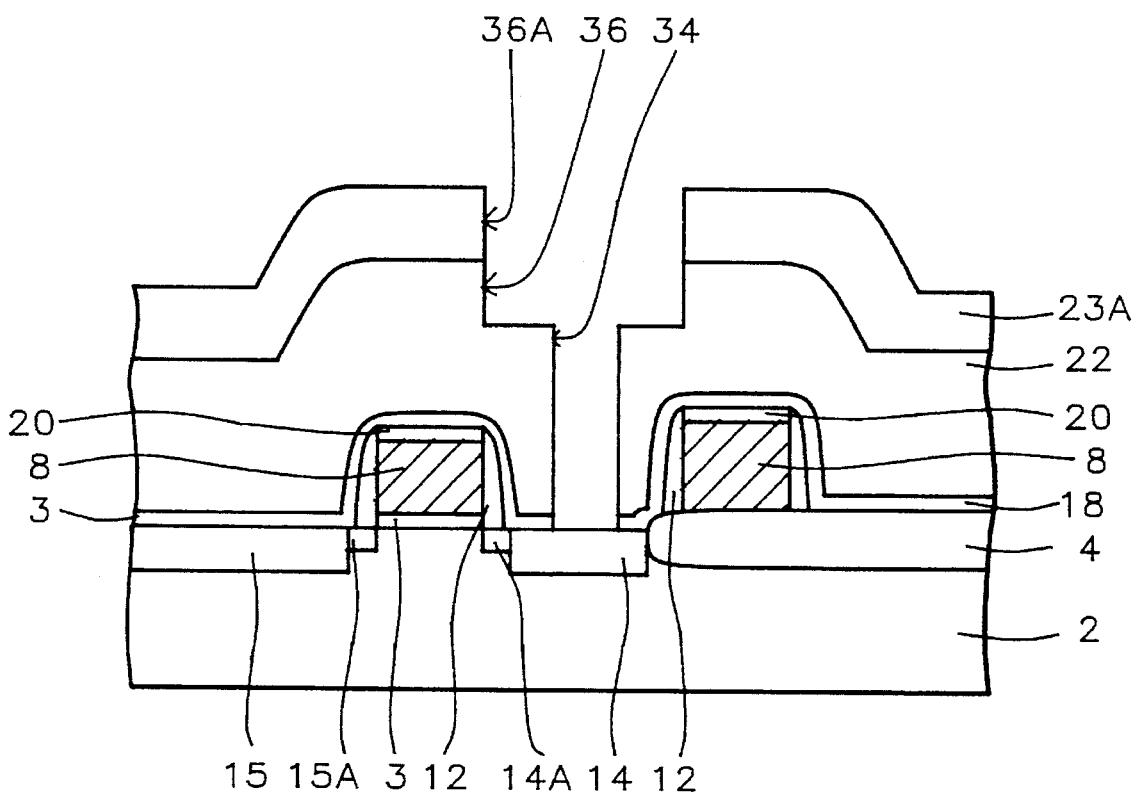

As shown in FIG. 5, the first insulation layer 22 is anisotropically etched using the resist layer 23A as a mask. The first hole 34A is extended through the first insulation 22 and barrier 18 layers to expose the region 14. Also, the first insulation layer 22 is etched through the second opening 36A thereby forming a second hole 36 into the first insulation layer to a depth less than the thickness of the first insulation layer. The second hole 36 (e.g., the storage electrode defining hole) s defined by sidewalls 36 of the first insulation layer 22.

The second hole 36 has a depth in the range of between about 2500 and 5000 Å and more preferably about 4000 Å.

A conventional dry etch can be used to etch the oxide first insulation layer 22 using CHF$_3$/CF$_4$/Ar gasses.

The end point for the anisotropic can be accurately determined by using optical emission spectroscopy and monitoring one the spectral lines of the etch by product over the wafer in the plasma chamber. For example, one can monitor the spectral emission of the silicon fluoride (SiF) by-product a spectral wavelength of 4050 Å. The technique relies on the change in the emission of the characteristic spectral line as the etched surface changes from one type of material to another. In this way the end point can be accurately detected when the first insulation layer (SiO$_2$) is etched to the substrate 2. The etch process is then terminated. This provides a means for etching from wafer to wafer and process run to process run making a more manufactured process.

The resist layer 23A is then removed. This can be performed in an O$_2$ plasma photoresist stripper.

Figure 6:
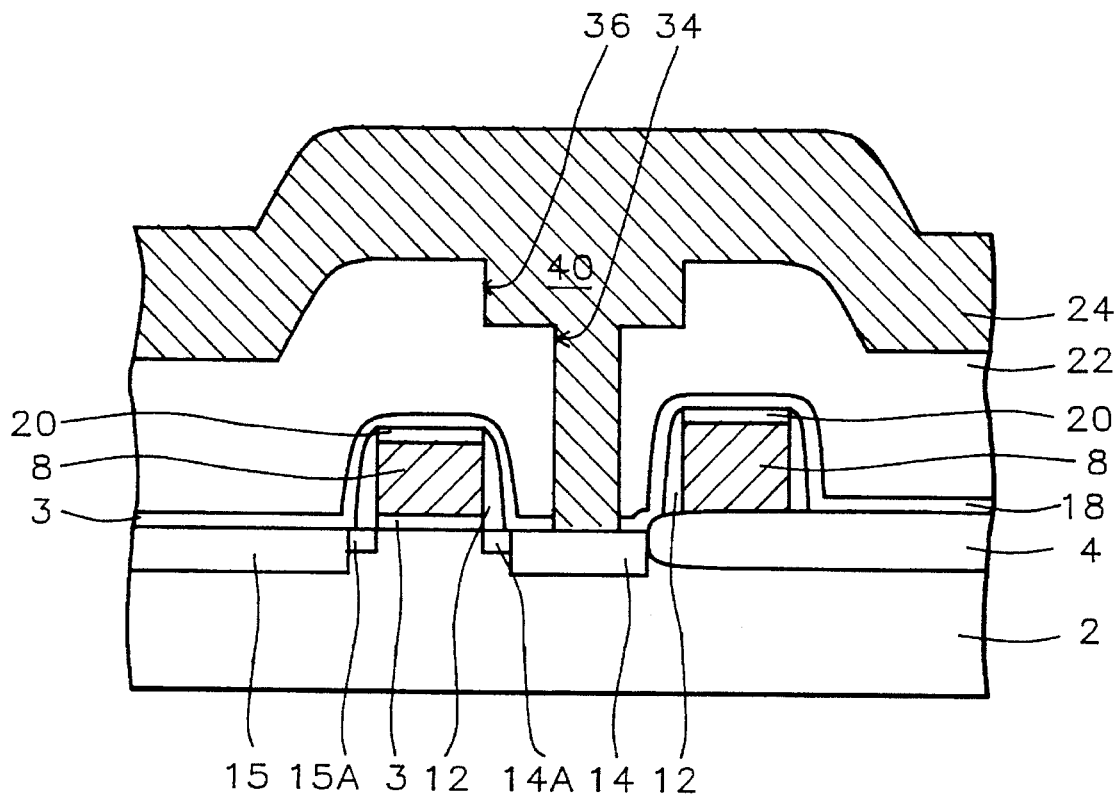

As displayed FIG. 6, a first polysilicon layer 24 is formed which completely fills the first hole 34, the second hole 36, and covers the top surface of the first insulation layer 22. The first polysilicon layer is preferably formed of polycrystalline silicon being doped with conductive impurities, such as A or P, with impurity concentrations in the range of between about 1E20 and 1E22 atoms/cm$^3$ and has a thickness in the range of between about 1500 and 4000 Å.

Figure 7:
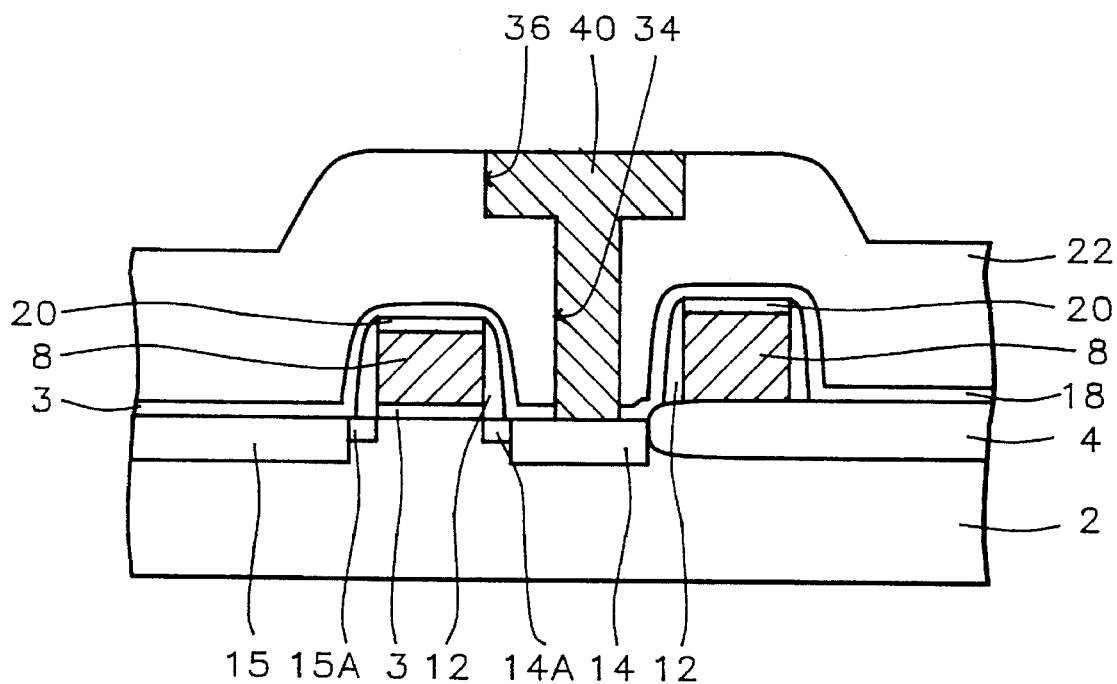

As shown in FIG. 7, the first polysilicon layer 24 on the top of the first insulation layer 22 is removed thereby exposing the first insulation layer 22. Preferably the first polysilicon layer 24 is preferably etched using an anisotropic plasma etch such as a magnetic enhanced Reactive Ion Etch (MERIE).

Figure 8:
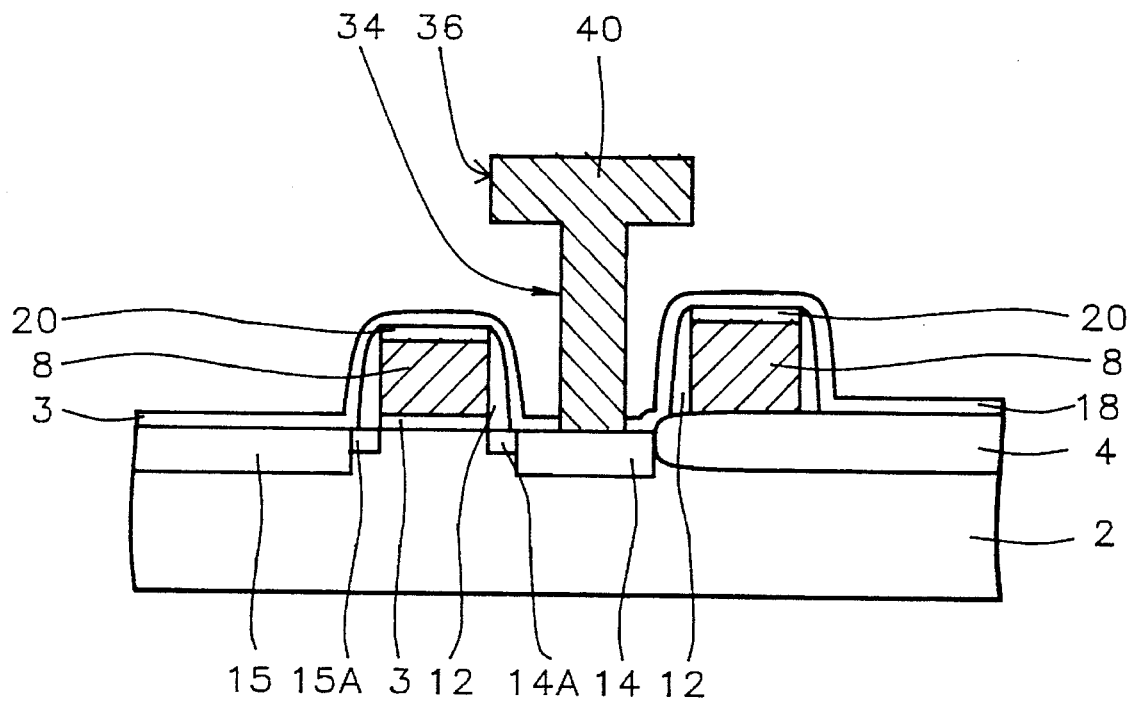

As shown in FIG. 8, the first insulation layer 22 is isotropically etched thereby forming a T-shaped storage electrode 28 from the remaining first polysilicon layer 24. A wet etching process can be performed with a surfactant buffered oxide etchant (SBOE), which is a material produced by adding a surface active agent to a mixture of NH$_4$F and HF. The etch can before about one to two minutes. The etch selectively etches silicon oxide over the polysilicon. The first barrier layer 18 serves as an etch stop layer to protect the underlying layers.

Figure 9:
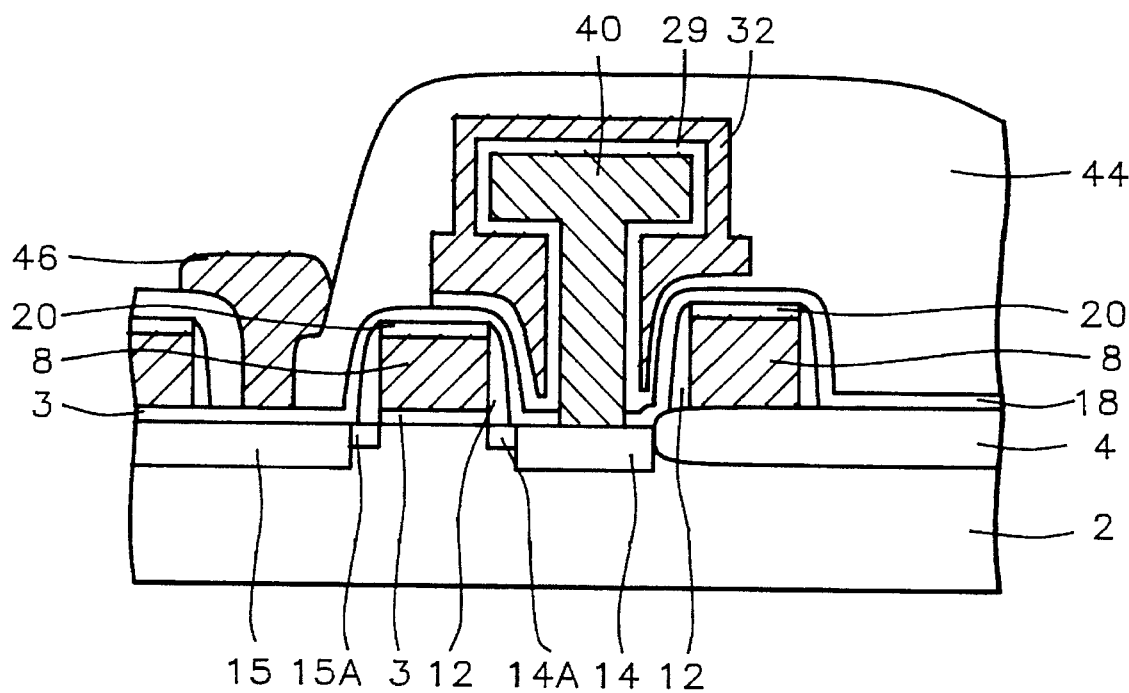

As shown in FIG. 9, a capacitor dielectric layer 29 is formed over the storage electrode 28. The material of the dielectric layer 29 can be any suitable material having a high dielectric constant and being contiguous and pinhole free. The conformal dielectric layer 29 can be formed of silicon nitride, an oxide/nitride/oxide (ONO) film, tantalum pentoxide (Ta$_2$O$_5$), and silicon oxide material. Preferably, the conformal dielectric layer is formed of ONO. The conformal dielectric layer 29 preferably has a thickness in the range between about 20 and 100 Å.

A top electrode 32 is formed over the dielectric layer as shown in FIG. 9. This is accomplished by forming a doped conductive layer over the substrate surface. A polysilicon layer can be formed and doped in situ or alternately ion implanted with impurities to obtain the proper doping level. The doped conductive layer is masked and etched, using conventional photolithographic techniques, to form the top plate electrode 32. The top electrode preferably has a thickness in the range between about 1000 and 2000 Å and more preferably about 1500 Å. The top plate eledtrode is preferably formed a polycrystalline silicon doped with an impurity. The top plate electrode/third conductive layer can have an impurity concentration in the range of between about 1E20 and 1E22 atoms/cm$^3$.

As shown in FIG. 9, a top insulation layer 44 is formed over the resulting surface to act as an inter-metal insulation layer the subsequent metal layers formed on top. The top insulation layer can be formed of BPSG, or other silicon oxides. The top insulation layer preferably has a thickness in the range of between about 3000 and 8000 Å.

Next, a bit line contact hole is formed in the top insulation layer 44 and a bit line contact 46 is formed contactifig the region 15. Other passivation and metallurgy layers are formed connecting elements in the substrate to form memory cells having a T-shaped capacitor 40 29 32.

The process off the present invention provides a novel method of defining both the node contact hole and the storage electrode using only one mask. The contact node opening 34A in the first photoresist mask 23 is enlarged by a plasma treatment thereby creating wider a second opening 36A that defines the storage electrode. This novel process reduces the masking steps used and therefore reduces process costs and increases yields. Also the one step blanket polysilicon and silicon oxide etchers which form the storage electrode (see FIGS. 7 and 8) eliminates several photo/etch step thus making the invention less costly and increasing yields. Moreover, the process forms a high capacitance capacitor in the limited area over the device area associated with the capacitor.

While the invention has been particularly shown and described with reference to the preferred embodiments thereof, it will be understood by those skilled in the art that various changes in form and details may made without departing from the spirit and scope of the invention.

What is claimed is:

1. A method of fabricating a memory cell having a gate electrode formed on a substrate disposed between a source and a drain, comprising the sequential processes of:

forming a barrier layer over a substrate surface and said gate electrode;

forming a first insulation layer over first barrier layer;

forming a resist layer over said first insulation layer, said resist layer having a first opening over said source;

etching a first hole defined by said first opening said first insulation layer, said first hole extends partially through said first insulation layer, said first hole having a depth less than a thickness of said first insulation layer;

laterally etching said resist layer with an oxygen plasma thereby enlarging said first opening in said resist layer to form a second opening over said source, said second opening being concentric with said first hole and having a larger area than said first hole;

anisotropically etching said first insulation layer and said barrier layer using said etched resist layer as a mask and extending said first hole through said first insulation layer to expose said source, and etching said first insulation layer through said second opening thereby forming a second hole into said first insulation layer to a depth less than the thickness of said first insulation layer, said second hole being defined by sidewalls of said first insulation layer;

removing said resist layer;

forming a first polysilicon layer completely filling said extended first hole and said second hole and covering a top surface of said first insulation layer;

etching back solid first polysilicon layer removing said first polysilicon layer covering the top surface of said first insulation layer, and removing said first insolation layer using said barrier layer as an etch stop thereby forming a T-shaped storage electrode;

forming a dielectric layer and a top electrode over said storage electrode, and forming a top insulation layer over said substrate thereby completing said memory cell.

2. The method of claim 1 wherein said barrier layer is formed of silicon nitride having a thickness in a range of between about 500 and 2000 Å.

3. The method of claim 1 wherein first insulation layer is composed of silicon oxide and has a thickness in a range of between about 5000 and 10,000 Å.

4. The method of claim 1 wherein said first opening has an open dimension in range of between about 0.1 and 0.5 µm.

5. The method of claim 1 wherein said first hole that extends partially through said first insulation layer has a depth in a range of between about 3000 and 5000 Å.

6. The method of claim 1 wherein said second opening has an open dimension in a range of between about 0.2 and 0.7 µm.

7. The method of claim 1 wherein said second hole has a depth in a range of between about 2500 and 5000 Å.

8. The method of claim 1 wherein said first polysilicon layer is formed of polycrystalline silicon being doped with conductive impurities with an impurity concentrations in range of between about 1E20 and 1E22 atoms/cm$^3$ and has a thickness in a range of between about 1500 and 4000 Å.

9. The method of claim 1 wherein said dielectric layer is formed of a layer of silicon oxide, a layer of silicon nitride, and a layer of silicon oxide (ONO) and said dielectric layer has a total thickness in a range between about 20 and 100 Å.

10. The method of claim 1 wherein said top electrode has a thickness in the range between about 1000 and 2000 Å and a dopant concentration in a range of between about 1E20 and 1E22 atoms/cm$^3$.

11. A method of manufacturing a T-shaped capacitor over a node in a substrate, comprising the steps of:

forming a first insulation layer over a substrate surface;

forming a resist layer over said first insulation layer, said resist layer having a first opening over said node;

etching said first insulation layer through said first opening forming a node contact hole defined by said first opening in said first insulation layer, said node contact hole extending partially through said first insulation layer, said node contact hole having a depth less than a thickness of said first insulation layer;

laterally etching said resist layer with an oxygen plasma thereby widening said first opening in said resist layer to form a second opening over said node, said second opening being concentric with said not contact hole and having a larger area than said node contact hole;

anisotropically etching said first insulation layer using said etched resist layer as a mask and extending said node contact hole through said first insulation layer to expose said node, and etching said first insulation layer through said second opening thereby forming a storage electrode hole into said first insulation layer to a depth less than the thickness of said first insulation layer, said storage electrode hole being defined by sidewalls of said first insulation layer;

removing said resist layer;

forming a first polysilicon layer completely filling said extended node contact hole and said storage electrode hole and covering a top surface of said first insulation layer;

etching back said first polysilicon layer on the top surface of said first insulation layer thereby exposing said first insulation layer;

selectively etching said first insulation layer thereby forming a T-shaped storage electrode from remaining portions of said first polysilicon layer; and forming a dielectric layer and a top electrode over said storage electrode thereby completing said T-shaped capacitor.

12. The method of claim 11 wherein said substrate further includes spaced gate electrodes surrounding said node, and a barrier layer over said substrate surface, said barrier layer formed of silicon nitride.

13. The method of claim 11 wherein first insulation layer is composed of silicon oxide and has a thickness in a range of between about 5000 and 10,000 Å.

14. The method of claim 11 wherein said first opening has an open dimension in a range of between about 0.1 and 0.5 µm.

15. The method of claim 11 wherein said node contract hole that extends partially through said first insulation layer has a depth in range of between about 3000 and 5000 Å.

16. The method of claim 11 wherein said second opening has an open dimension in range of between about 0.2 and 0.7 µm.

17. The method of claim 11 wherein said storage electrode hole has a depth in a range of between about 2500 and 5000 Å.

18. The method of claim 11 wherein said first polysilicon layer is formed of polycrystalline silicon being doped with conducive impurities with an impurity concentrations in a range of between about 1E20 and 1E22 atoms/cm$^3$ and has a thickness in range of between about 1500 and 4000 Å.

19. The method of claim 11 when in said dielectric layer is formed of a layer of silicon oxide, a layer of silicon nitride, and a layer of silicon oxide (ONO), and said dielectric layer has a total thickness in a range between about 20 and 100 Å.

20. The method of claim 11 wherein said top electrode has a thickness in a range between about 1000 and 2000 Å and a dopant concentration in a range of between about 1E20 and 1E22 atoms/cm$^3$.

\* \* \* \* \*